(12) United States Patent
O'Hara

(10) Patent No.: US 9,786,526 B2
(45) Date of Patent: Oct. 10, 2017

(54) SELECTIVITY IN A XENON DIFLUORIDE ETCH PROCESS

(75) Inventor: Anthony O'Hara, Edinburgh (GB)

(73) Assignee: MEMSSTAR, LIMITED, Edinburgh (GB)

( * ) Notice: Subject to any disclaimer, the term of this patent is extended or adjusted under 35 U.S.C. 154(b) by 0 days.

(21) Appl. No.: 13/497,936

(22) PCT Filed: Sep. 27, 2010

(86) PCT No.: PCT/GB2010/051611
§ 371 (c)(1),
(2), (4) Date: Jun. 5, 2012

(87) PCT Pub. No.: WO2011/036496
PCT Pub. Date: Mar. 31, 2011

(65) Prior Publication Data
US 2012/0238101 A1    Sep. 20, 2012

(30) Foreign Application Priority Data

Sep. 25, 2009  (GB) .................................. 0916871.7

(51) Int. Cl.
| *B44C 1/22* | (2006.01) |
| *C23F 1/00* | (2006.01) |
| *C23F 3/00* | (2006.01) |
| *H01L 21/67* | (2006.01) |
| *B81C 1/00* | (2006.01) |
| *H01L 21/3065* | (2006.01) |

(52) U.S. Cl.
CPC .... *H01L 21/67069* (2013.01); *B81C 1/00595* (2013.01); *H01L 21/3065* (2013.01); *B81C 2201/0132* (2013.01)

(58) Field of Classification Search
USPC ....................................... 216/2; 438/706, 710
See application file for complete search history.

(56) References Cited

U.S. PATENT DOCUMENTS

| 6,290,864 | B1 | 9/2001 | Patel et al. |
| 2002/0195423 | A1 | 12/2002 | Patel et al. |
| 2008/0035607 | A1 | 2/2008 | O'Hara et al. |

FOREIGN PATENT DOCUMENTS

| WO | WO-01/30715 A1 | 5/2001 |
| WO | WO-2009/034697 A1 | 3/2009 |

OTHER PUBLICATIONS

Ekoue, Adamah, "International Search Report" for PCT/GB2010/051611, as mailed Feb. 16, 2011, 4 pages.

*Primary Examiner* — Roberts Culbert
(74) *Attorney, Agent, or Firm* — Saul Ewing Arnstein & Lehr LLP

(57) ABSTRACT

A method and an apparatus for etching microstructures and the like that provides improved selectivity to surrounding materials when etching silicon using xenon difluoride (XeF2). Etch selectivity is greatly enhanced with the addition of hydrogen to the process chamber.

6 Claims, 3 Drawing Sheets

SELECTIVITY IN A XENON DIFLUORIDE ETCH PROCESS

FIELD OF THE INVENTION

The present invention relates to a method of etching which provides improved selectivity to surrounding materials when etching silicon using xenon difluoride ($XeF_2$). In particular, the etch selectivity to silicon nitride is greatly enhanced with the addition of another gas.

BACKGROUND OF THE INVENTION

In the manufacture of microstructures, for example microelectromechanical structures (MEMS), gas-phase etching processes are used to remove sacrificial (i.e. unwanted) areas of material so as to leave behind the remaining material which constitutes the desired structure.

For example, xenon difluoride ($XeF_2$) is commonly used to remove sacrificial areas of silicon in the manufacture of MEMS. $XeF_2$ demonstrates high selectivity and has a relatively high etch rate when etching silicon. However, for the manufacture of more complex and higher quality MEMS devices, it is desirable to improve the selectivity of $XeF_2$ processes over conventional techniques.

SUMMARY OF THE INVENTION

According to a first aspect of the present invention, there is provided a method of etching silicon (Si) in a process chamber to produce one or more microstructures, the method comprising the steps of:
(a) producing an etching material vapour comprising xenon difluoride ($XeF_2$) from an etching material source;
(b) transporting etching material vapour to the process chamber; and
(c) introducing a secondary gas comprising hydrogen to the process chamber.

$XeF_2$ gas etches Si with the primary reaction as defined by the following expression:

$$2XeF_2 + Si \rightarrow 2Xe + SiF_4 \quad (1)$$

This reaction is well known, however the Applicant has discovered that the use of hydrogen as a secondary gas results in a highly significant increase in the quality and selectivity of etch that may be achieved.

Preferably, the step of transporting the etching material vapour to the process chamber comprises supplying a carrier gas to the etching material source, the carrier gas thereafter carrying the etching material vapour to the process chamber.

Alternatively, or additionally, the step of transporting the etching material vapour to the process chamber comprises employing one or more expansion chambers to collect etching material vapour from the etching material source.

Preferably, the method comprises the additional step of controlling the amount of etching material vapour within the process chamber by controlling a vacuum pumping rate out of the process chamber.

Alternatively, the method comprises the additional step of circulating the etching material vapour.

Preferably, the method comprises the additional step of providing a mask overlying the silicon so as to allow selective etching of the silicon.

According to a second aspect of the present invention, there is provided a gas phase etching apparatus for etching silicon (Si) to produce one or more microstructures, the apparatus comprising:
a process chamber for receiving silicon to be etched;
a xenon difluoride vapour source;
a first gas line connecting the xenon difluoride vapour source to the process chamber;
a hydrogen gas source; and
a second gas line connecting the hydrogen gas source to the process chamber.

Preferably, the apparatus further comprises a carrier gas source to carry xenon difluoride vapour from the xenon difluoride vapour source to the process chamber.

Alternatively, or additionally, the apparatus further comprises one or more expansion chambers to collect etching material vapour from the etching material source.

Further alternatively, the second gas line is connected to the xenon difluoride vapour source, the hydrogen gas source employed to carry xenon difluoride vapour to the process chamber.

Preferably, the apparatus further comprises a vacuum pump connected to the process chamber, the amount of etching material vapour and/or hydrogen gas within the process chamber being controlled by controlling the pumping rate of the vacuum pump.

Alternatively, or additionally, the apparatus further comprises one or more flow controllers connected to the first and or the second gas lines to control the amount of etching material vapour and/or hydrogen gas within the process chamber.

Alternatively, the apparatus is configured so as to circulate the etching material vapour and/or hydrogen gas.

BRIEF DESCRIPTION OF THE FIGURES

The present invention will now be described by way of example only and with reference to the accompanying figures in which.

DETAILED DESCRIPTION OF THE INVENTION

Figure 1:
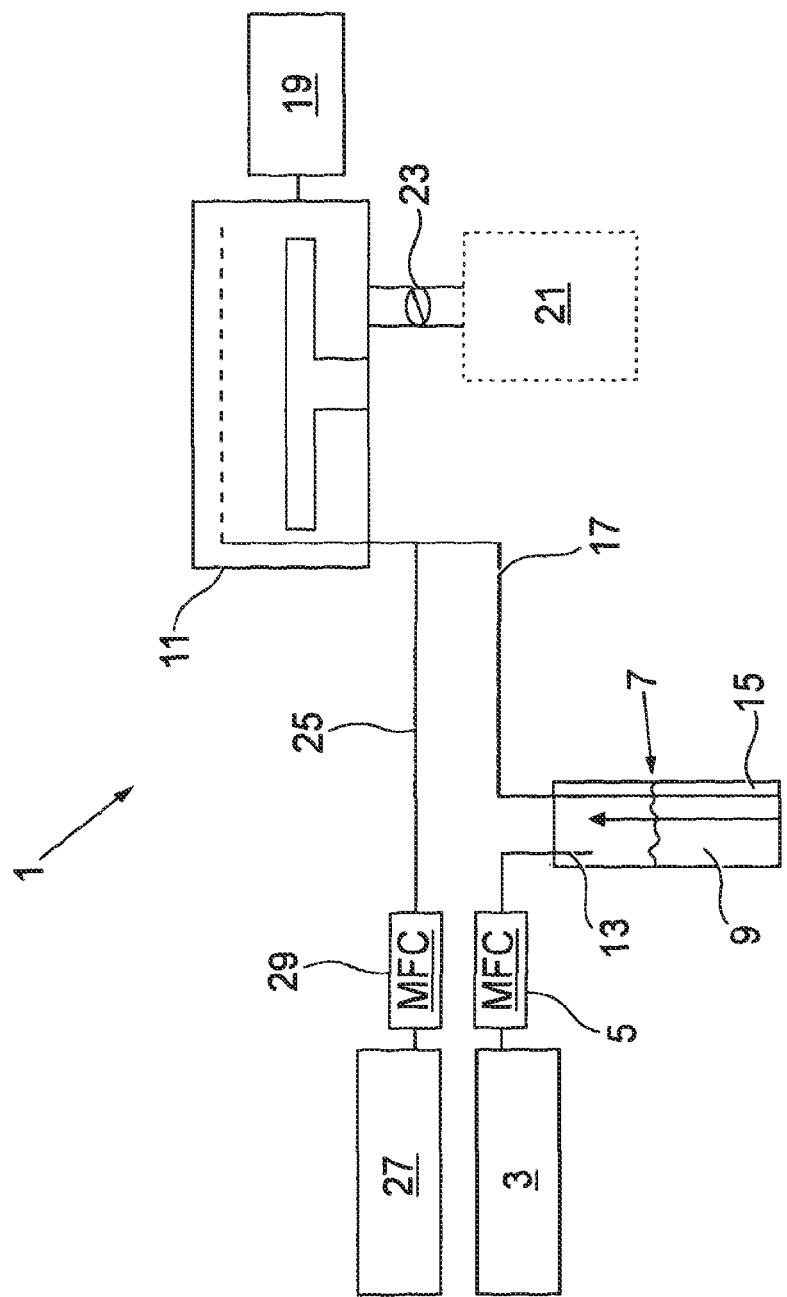
FIG. 1 illustrates in schematic form a gas delivery setup for an etch process in accordance with the present invention.

With reference to FIG. 1, there is presented a gas delivery system 1 that enables an improved selectivity etch process to be carried out, as will be described in detail below.

The system comprises a carrier gas source 3 which provides a carrier gas, the flow rate of which is determined by a mass flow controller (MFC) 5, and a sublimation chamber 7 in which a xenon difluoride ($XeF_2$) source 9 sublimates to produce an etchant vapour to be carried to the process chamber 11 by the carrier gas 3. The carrier gas 3 is preferably an inert gas such as helium, or alternatively may comprise nitrogen or a nitrogen-based gas. The sublimation chamber 7 has an inlet 13 (for the carrier gas) above the $XeF_2$ source 9 (crystals) and an outlet 15 (for the carrier gas plus etchant vapour) beneath the $XeF_2$ source 9 which improves the take-up of etchant vapour by the carrier gas 3. Of course, the inlet 13 and outlet 15 may be arranged in the opposite sense.

The outlet 15 is connected to the process chamber by a supply line 17. A pressure gauge 19 monitors the pressure in the process chamber 11. The pumping rate of the vacuum pump 21 and/or the MFC 5 can be controlled to maintain a set operating pressure within the process chamber 11. The use of an adaptive pressure controller 23 (APC) enables accurate control of the process chamber pressure. Note that in an alternative embodiment, the gases within the process chamber may be circulated, in which case the vacuum pump serves to initially evacuate the process chamber (thus drawing in etchant vapour) or evacuate the process chamber subsequent to completion of the etch step.

Also connected to the supply line 17 (or, alternatively, directly to the process chamber) is an additional gas line 25 connected to an additional or secondary gas source 27. Similarly to the carrier gas line 17, the flow rate of the additional or secondary gas is determined by a mass flow controller (MFC) 29. Accordingly, the amount of the additional or secondary gas 27 flowing into the process chamber 11 along with the carrier gas 3 and etchant vapour can be controlled.

U.S. Pat. No. 6,290,864 in the name of Patel et al, teaches improvement of etch selectivity by noble gas or halogen fluorides by the addition of non-etchant gaseous additives having a molar averaged formula weight below that of molecular nitrogen. The preferred additive gas is helium, neon, or mixtures of helium and/or neon with one or more of higher formula weight (for example, nitrogen and argon) although it is suggested that any non-etchant gas may be used. Particularly preferred are helium and mixtures of helium and nitrogen or argon.

Patel et al presents experimental results to substantiate the claimed selectivity improvement achieved using the preferred additives. For example, a selectivity improvement of 5× is achieved using one of $N_2$, Ar and He.

Figure 2:
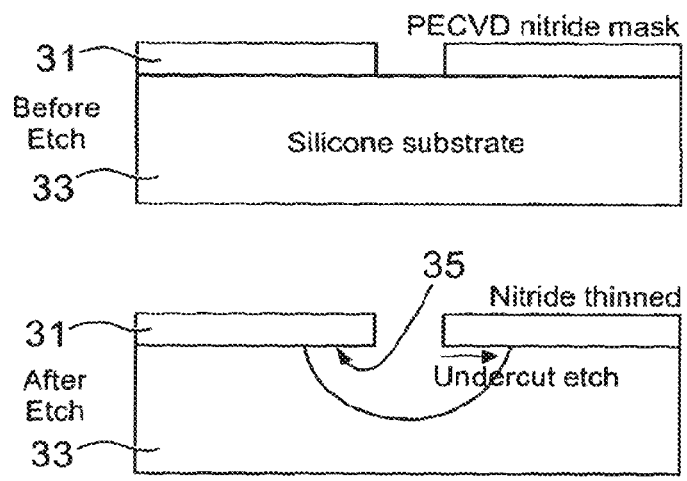
FIG. 2 illustrates in schematic form a layer of PECVD Silicon Nitride on top of a silicon wafer (a) before etching and (b) after etching.

However, the Applicant in the case of the present Application has made a surprising discovery that the use of hydrogen as an additional gas provides selectivity improvements on the order of hundreds. By way of example, FIG. 2 illustrates in schematic form a layer of PECVD silicon nitride 31 on top of a silicon wafer 33 (a) before etching and (b) after etching. The nitride layer 31 was patterned and used as a mask to etch the underlying silicon substrate 33 using $XeF_2$.

To quantify the improved etch selectivity, recipes producing the same etch rate were used to give a fair comparison between the standard recipe and the improved selectivity recipe. For example, a carrier gas of $N_2$ flowing at 50 sccm will transport 25 sccm of $XeF_2$ to the etch chamber, with the chamber set at 9 Torr. The improved recipe has in addition a $H_2$ flow of 20 sccm. A two minute etch was performed, at which time the silicon undercut etch 35 measured 6 μm. The following table provides a summary of the comparison between the after-etch thicknesses of the nitride mask 31 using the standard and the improved recipe:

| | Nitride thickness (Å) |
|---|---|
| Standard recipe | |
| Before | 3212 |
| After | 644 |
| Nitride removed | 2568 |
| Improved recipe | |
| Before | 3192 |
| After | 3183 |
| Nitride removed | 9 |

(The nitride thickness was measured at a number of different locations so as to provide the above mean values).

Figure 3:
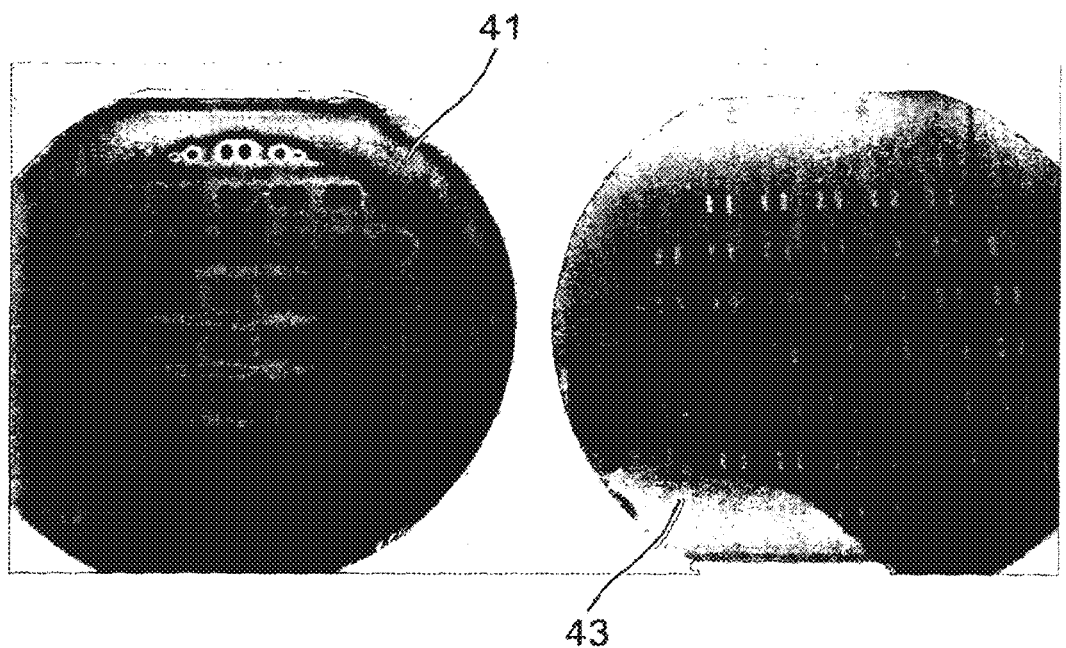
FIG. 3 is a photograph illustrating the improved selectivity achieved using an etch process in accordance with the present invention.
Figure 4:
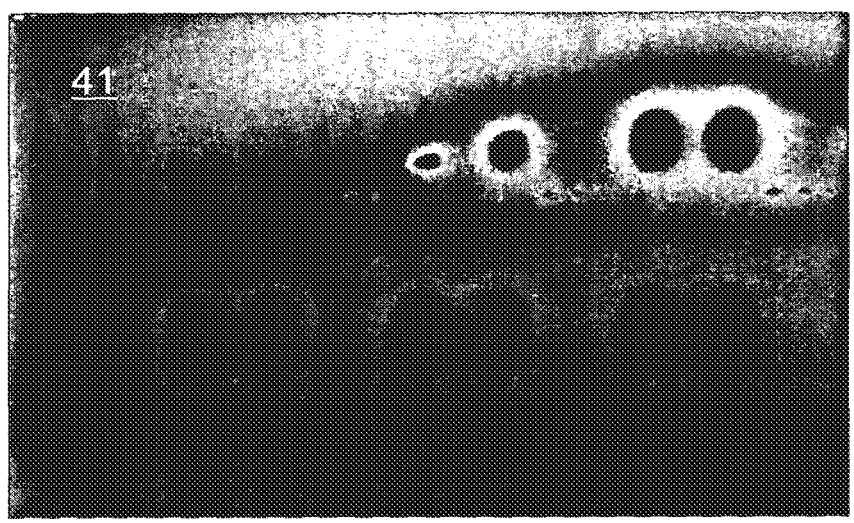
FIG. 4 presents enlargements of the upper left regions of the wafers shown in FIG. 3.
Figure 4:
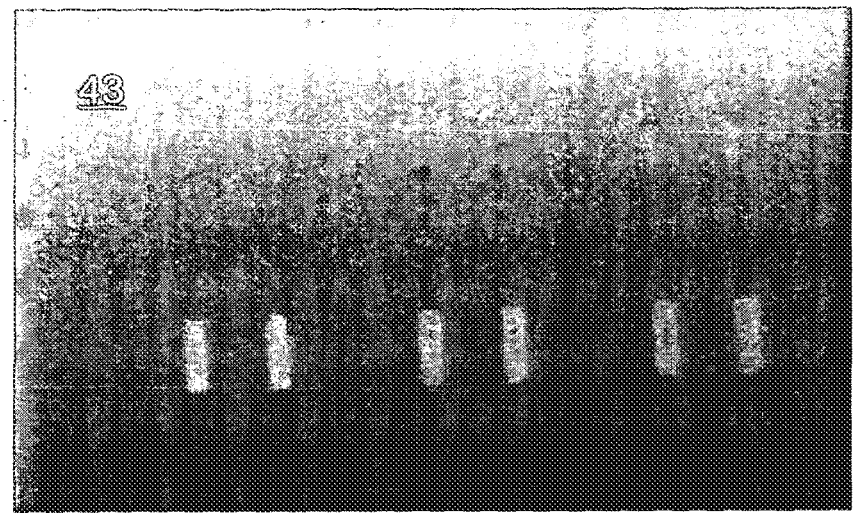

As is readily apparent from the tabulated numbers, the selectivity of the improved selectivity recipe is, on average, approximately 270× that of the standard recipe. The improvement achieved is also apparent on visual inspection. FIG. 3 is a photograph of the test wafers (with enlargements of the upper left regions presented in FIG. 4) from the above comparison. It is clear that the selectivity on the second test wafer 43 (improved selectivity recipe) is a vast improvement over the selectivity on the first test wafer 41 (standard selectivity recipe).

It is also noted that in Patel et al, the selection of non-etchant gaseous additives having a molar averaged formula weight below that of molecular nitrogen is a somewhat arbitrary selection based on the effect on the etch time, and not because of any demonstrated reduction in selectivity above this value. Importantly, no link between said molar averaged formula weight of the gaseous additive and the improvement in selectivity has been presented—although it is also noted that higher formula weight non-etchant gases are preferred.

A number of alternative embodiments of the present invention are envisaged (but not necessarily illustrated in the drawings). For example, the hydrogen gas may be employed as the carrier gas. Alternatively, and rather than employing a carrier gas to transport the etch vapour to the process chamber, one or more expansion chambers may be employed in which reserves of vapour are collected and pumped or transferred to the process chamber as and when required. A carrier gas may of course be used in conjunction with one or more expansion chambers.

While the described embodiment employs a vacuum pump which pumps carrier gas, etch vapour, etch by-product and the secondary hydrogen out of the process chamber, thus creating a flow of etchant and hydrogen therethrough, it is also envisaged that the etchant and hydrogen could be recirculated.

Further investigation of the mechanisms leading to the greatly enhanced selectivity have been undertaken in an attempt to understand the process involved. In Patel et al, it is seen that there is an improvement in selectivity by adding a buffer gas. There appears to be very little if any improvement in selectivity between buffer gases used. The addition of $H_2$ in accordance with the present invention provides a dramatic improvement and is believed to be due to the different reason for the additive.

A blanket silicon nitride wafer, no silicon etch taking place, is not etched by $XeF_2$. However, it is observed that when etching silicon with $XeF_2$ the surrounding nitride is etched. This suggests that a by-product of the etch is reacting with the silicon nitride. The hitherto unknown step of introducing the additional $H_2$ gas is believed to create a reaction with the by-products before they can react with the silicon nitride. This is not the mechanism described in Patel et al.

The applicant has made the surprising discovery that adding $H_2$ to the process chamber improves the silicon etch selectivity to oxide and nitride. The $H_2$ is understood to react with etch by-products that etch the oxide and nitride. These etch by-products also etch silicon, so a result of adding $H_2$ to the process is that the silicon etch rate drops. This drop is between 10-50% depending on the structure being etched and the process being used.

(Note that the etch by-product can be a result of an incomplete etch reaction, and as such may be $SiF$, $SiF_2$, etc. Also, as the etch is exothermic the heat generated can cause $XeF_2$ to break up producing F that will also react with the silicon, silicon dioxide and silicon nitride.)

Further modifications and improvements may be added without departing from the scope of the invention herein described. For example, while the invention is illustrated using an example wherein a carrier gas is used to transport etch vapour from the sublimation chamber to the process chamber, it is foreseen that the carrier line could comprise a single conduit or, as described above, comprise one or more expansion chambers or the like instead.

The invention claimed is:

1. A method of etching a substrate comprising silicon (Si) in a process chamber to produce one or more microstructures in the substrate, the method consisting of contacting in the process chamber the substrate comprising Si, an etching material vapour consisting of xenon difluoride ($XeF_2$) and nitrogen gas, and a secondary gas consisting of hydrogen gas, wherein the secondary gas reacts with Si etching byproducts, whereby one or more microstructures are produced in the substrate.

2. The method of claim 1, wherein the volume ratio of xenon fluoride:nitrogen gas:hydrogen gas in the process chamber is about 25:50:20.

3. The method of claim 1, wherein the etching material vapour is transported to the process chamber employing one or more expansion chambers that collect etching material vapour from the etching material source.

4. The method of claim 1, wherein the amount of etching material vapour within the process chamber is controlled by a vacuum pump that pumps gas out of the process chamber.

5. The method of claim 1, wherein the etching material vapour is recirculated in the process chamber.

6. The method of claim 1, wherein a mask overlays the substrate comprising silicon so as to allow selective etching of the silicon.

* * * * *